US011675957B2

(12) United States Patent
Kuo et al.

(10) Patent No.: US 11,675,957 B2
(45) Date of Patent: *Jun. 13, 2023

(54) INTEGRATED CIRCUIT STACK VERIFICATION METHOD AND SYSTEM FOR PERFORMING THE SAME

(71) Applicant: TAIWAN SEMICONDUCTOR MANUFACTURING COMPANY, LTD., Hsinchu (TW)

(72) Inventors: Feng Wei Kuo, Hsinchu (TW); Shuo-Mao Chen, Hsinchu (TW); Chin-Yuan Huang, Hsinchu (TW); Kai-Yun Lin, Hsinchu (TW); Ho-Hsiang Chen, Hsinchu (TW); Chewn-Pu Jou, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 93 days.

This patent is subject to a terminal disclaimer.

(21) Appl. No.: 17/319,687

(22) Filed: May 13, 2021

(65) Prior Publication Data

US 2021/0264094 A1 Aug. 26, 2021

Related U.S. Application Data

(63) Continuation of application No. 15/921,040, filed on Mar. 14, 2018, now Pat. No. 11,023,647, which is a
(Continued)

(51) Int. Cl.
*G06F 30/398* (2020.01)
*H01L 23/544* (2006.01)
*H01L 25/07* (2006.01)

(52) U.S. Cl.
CPC .......... *G06F 30/398* (2020.01); *H01L 23/544* (2013.01); *H01L 25/07* (2013.01); *H01L 2223/54426* (2013.01)

(58) Field of Classification Search
CPC ..... G06F 30/398; H01L 23/544; H01L 25/07; H01L 2223/54426
See application file for complete search history.

(56) References Cited

U.S. PATENT DOCUMENTS 5,489,554 A 2/1996 Gates
6,461,877 B1 10/2002 Holloway et al.
(Continued)

FOREIGN PATENT DOCUMENTS

CN 101924040 12/2010
CN 101866371 5/2012
(Continued)

OTHER PUBLICATIONS

Notice of Allowance dated Jan. 10, 2017 and English translation from corresponding application No. KR 10-2015-0162368.
(Continued)

*Primary Examiner* — Jack Chiang
*Assistant Examiner* — Aric Lin
(74) *Attorney, Agent, or Firm* — Hauptman Ham, LLP

(57) ABSTRACT

A method of verifying an integrated circuit stack includes adding a dummy layer to a contact pad of a functional circuit, wherein a location of the dummy layer is determined based on a location of a contact pad of a connecting substrate. The method further includes converting the dummy layer location to the connecting substrate. The method further includes performing a layout versus schematic (LVS) check of the connecting substrate including the
(Continued)

dummy layer in response to a determination that the dummy layer is aligned with the contact pad of the connecting substrate.

20 Claims, 5 Drawing Sheets

Related U.S. Application Data continuation of application No. 14/621,054, filed on Feb. 12, 2015, now Pat. No. 9,922,160.

(56) References Cited

U.S. PATENT DOCUMENTS

| | | | | |
|---|---|---|---|---|
| 9,922,160 B2* | 3/2018 | Kuo | | H01L 23/544 |
| 11,023,647 B2* | 6/2021 | Kuo | | H01L 23/544 |
| 2009/0064058 A1 | 3/2009 | McIlrath | | |
| 2009/0093099 A1* | 4/2009 | Kobayashi | | G06F 30/39 |
| | | | | 257/E21.705 |
| 2009/0319968 A1 | 12/2009 | Wang et al. | | |
| 2010/0162194 A1* | 6/2010 | Qian | | G06F 30/394 |
| | | | | 716/139 |
| 2010/0257495 A1* | 10/2010 | Wu | | H01L 23/585 |
| | | | | 716/111 |
| 2013/0007692 A1 | 1/2013 | Yeh et al. | | |
| 2014/0015104 A1 | 1/2014 | Su et al. | | |

FOREIGN PATENT DOCUMENTS

| | | |
|---|---|---|
| JP | S58159327 | 9/1983 |
| JP | S62229964 | 10/1987 |
| JP | 2011119438 | 6/2011 |
| KR | 20120112797 | 10/2012 |
| TW | 201037543 | 10/2010 |

OTHER PUBLICATIONS

Office Action dated Oct. 3, 2016 from corresponding application No. TW 104138993.

* cited by examiner

INTEGRATED CIRCUIT STACK VERIFICATION METHOD AND SYSTEM FOR PERFORMING THE SAME

PRIORITY CLAIM

The present application is a continuation of U.S. application Ser. No. 15/921,040, filed Mar. 14, 2018, which is a continuation of U.S. application Ser. No. 14/621,054, filed Feb. 12, 2015, now U.S. Pat. No. 9,922,160, issued Mar. 20, 2018, which are incorporated herein by reference in their entireties.

BACKGROUND

As technology nodes decrease, stacking circuits on top of one another is used to reduce an overall size of an integrated circuits. Stacking circuits includes forming electrical connections between the stacked circuits in order to transfer signals between different portions of the integrated circuit. Contact pads are commonly used to electrically connect the stacked circuits. If contact pads between different portions of the stacked circuits are not properly aligned, a risk of an open circuit or a short circuit is increased.

In some approaches, alignment marks are used to help align contact pads of the stacked circuits. The alignment marks are formed in a portion of the circuit away from functional components. An alignment mark of an upper circuit is positioned above an alignment mark of a lower circuit. The goal is that matching the alignment marks atop one another will result in an alignment between contacts pads on the upper circuit and contact pads on the lower circuit.

In order to achieve the goal of aligning the contact pads based on the alignment marks, a complete graphic database system (GDS) file for all stacked circuits is used. The complete GDS file includes the layout of each stacked circuit. Any adjustments within any one of the stacked circuits which changes a location of a contact pad is propagated through all stacked circuits to maintain proper alignment of contact pads in a completed circuit. In order to determine whether the designed stacked circuits are properly aligned, a test circuit is manufactured and tested in order to determine whether any open circuits or short circuits are present in the design.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
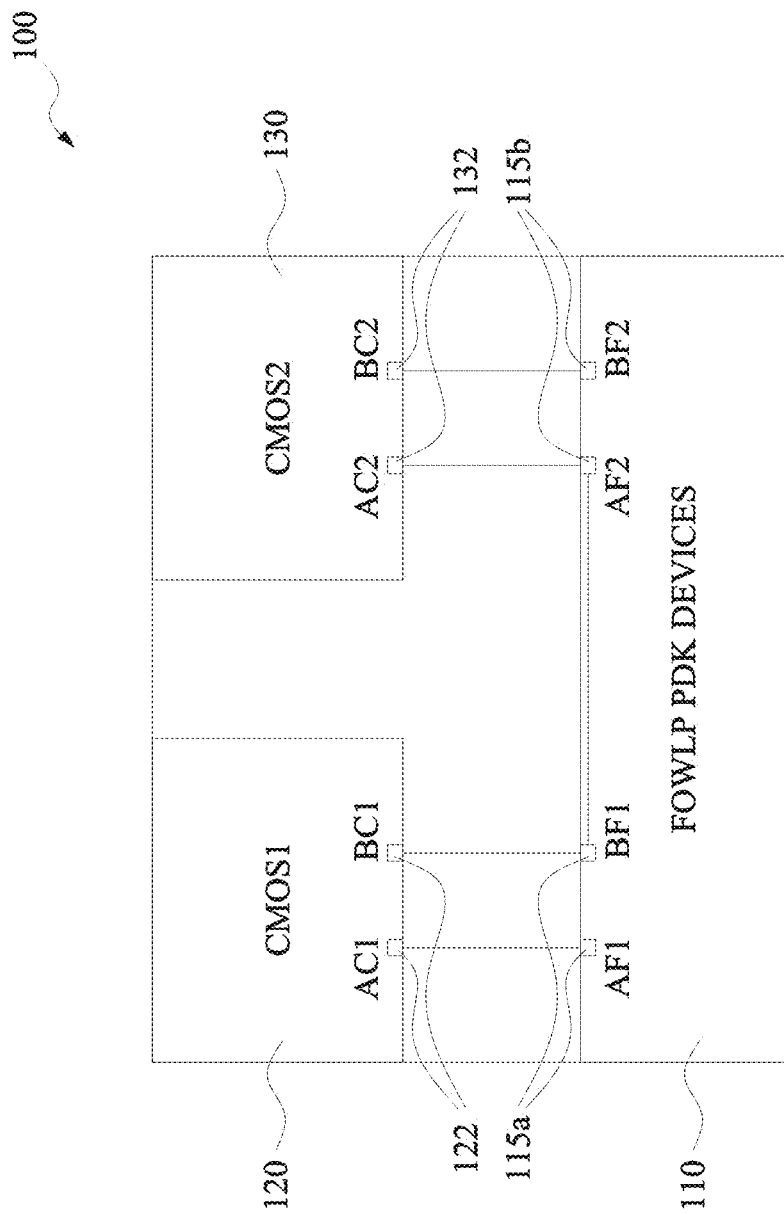
FIG. 1 is a view of an integrated circuit stack in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a view of an integrated circuit stack 100 in accordance with some embodiments. Integrated circuit stack 100 includes a connecting substrate 110. Connecting substrate includes a first set of contact pads 115a and a second set of contact pads 115b. A first functional circuit 120 is configured to electrically connect to connecting substrate 110. First functional circuit 120 includes functional circuitry configured to execute at least one operation of integrated circuit stack 100. First functional circuit 120 includes contact pads 122. Contact pads 122 are configured to electrically connect to first set of contact pads 115a. A second functional circuit 130 is configured to electrically connect to connecting substrate. Second functional circuit 130 includes functional circuitry configured to execute at least one operation of integrate circuit stack 100. Second functional circuit includes contact pads 132 configured to electrically connect to second set of contact pads 115b.

Connecting substrate 110 provides electrical connection between first functional circuit 120 or second functional circuit 120 and other circuitry (not shown). In some embodiments, additional functional circuits are connected to a same surface of connecting substrate 110 as first functional circuit 120 and second functional circuit 130. In some embodiments, at least one functional circuit is connected to a surface of connecting substrate 110 opposite first functional circuit 120 and second functional circuit 130. In some embodiments, connecting substrate 110 includes functional circuitry. In some embodiments, connecting substrate 110 includes only electrical routing devices and is free of functional circuitry. In some embodiments, connecting substrate 110 is a fan-out wafer level packaging (FOWLP) device, an interposer, an integrated fan-out package-on-package (InFo- POP) device, a wafer level chip scale package (WLCSP), or another suitable connecting device.

First set of contact pads 115a are electrically connected to internal circuitry or electrical routing devices within connecting substrate 110. Second set of contact pads 115b are electrically connected to internal circuitry or electrical routing devices within connecting substrate 110. In some embodiments, at least one contact pad of first set of contact pads 115a is electrically connected to at least one corresponding contact pad of second set of contact pads 115b. In some embodiments, first set of contact pads 115a and second set of contact pads 115b independently include an aluminum pad, a copper pad, a tungsten pad, or another suitable conductive pad.

First functional circuit 120 executes at least one operation based on signals from connecting substrate 110 or outputs a result of the at least one operation to the connecting substrate. Similarly, second functional circuit 130 executes at least one operation based on signals from connecting substrate 110 or outputs a result of the at least one operation to the connecting substrate. In some embodiments, first functional circuit 120 and second functional circuit 130 independently includes complementary metal-oxide-semiconductor (CMOS) devices, fin field-effect-transistor (FinFET) devices, other two-dimensional channel devices, other three-dimensional channel devices, or other suitable functional circuitry.

Contact pads 122 provide electrically connection to the functional circuitry within first functional circuit 120. Contact pads 122 are aligned with corresponding contact pads of first set of contact pads 115a to facilitate transfer of signals between first functional circuit 120 and connecting substrate 110. Misalignment of contact pads 122 with respect to first set of contact pads 115a increases a risk of an open circuit where at least one contact pad of contact pads 122 has little or no electrical connection with a corresponding contact pad of first set of contact pads 115a. Misalignment of contact pads 122 with respect to first set of contact pads 115a also increases a risk of a short circuit where at least one contact pad of contact pads 122 is electrically connected to multiple contact pads, or a wrong contact pad, of first set of contact pads 115a.

Contact pads 132 provide electrically connection to the functional circuitry within second functional circuit 130. Contact pads 132 are aligned with corresponding contact pads of second set of contact pads 115b to facilitate transfer of signals between second functional circuit 130 and connecting substrate 110. Misalignment of contact pads 132 with respect to second set of contact pads 115b increases a risk of an open circuit or a short circuit.

Figure 2:
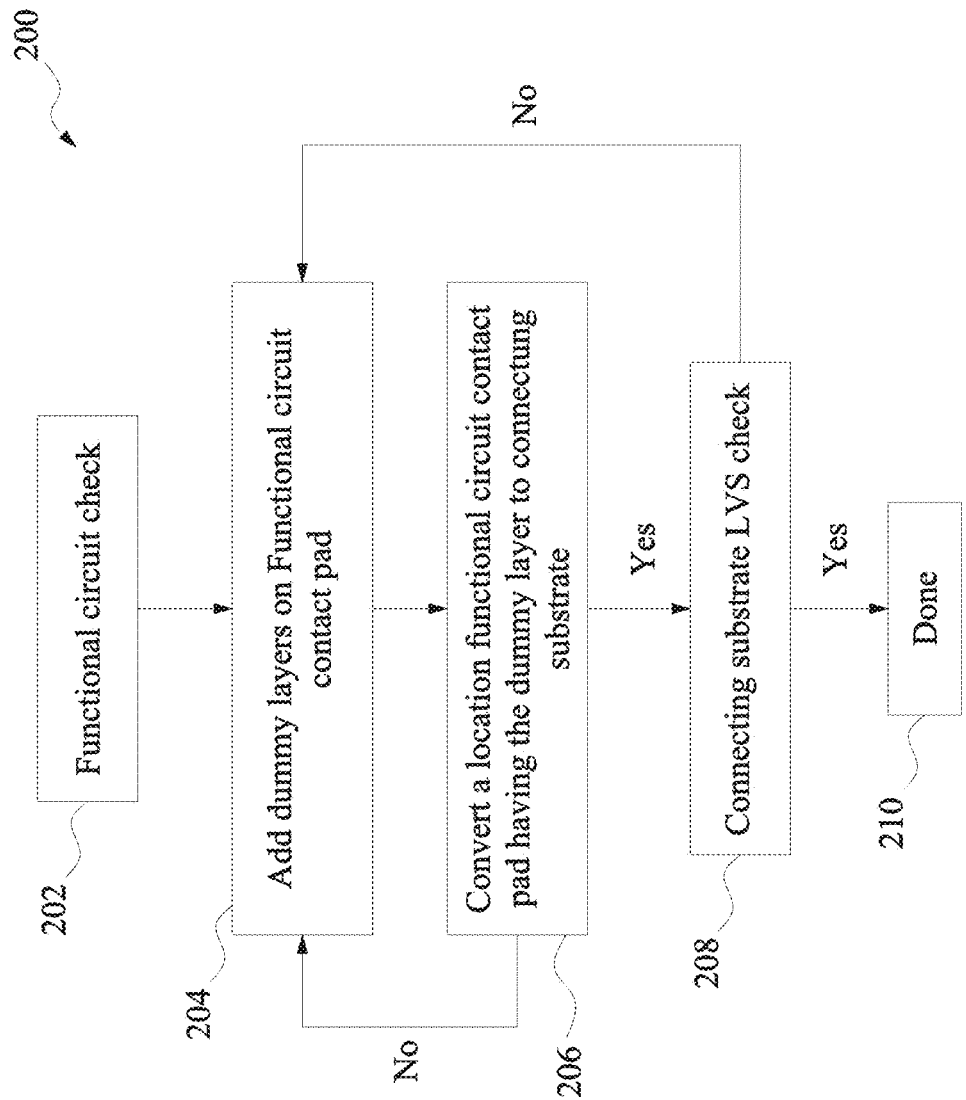
FIG. 2 is a flowchart of a method of verifying an integrated circuit stack in accordance with some embodiments.

FIG. 2 is a flowchart of a method 200 of verifying an integrated circuit stack in accordance with some embodiments. In operation 202 a check is performed on a functional circuit, e.g., first functional circuit 120 or second functional circuit 130 (FIG. 1). The functional circuit includes at least one contact pad, e.g., contact pads 122 or contact pads 132. The check includes determining that connections within the functional circuit result in proper execution of the functional circuit. In some embodiments, the check is performed by analyzing a graphic database system (GDS) file of the functional circuit. In some embodiments, the GDS file includes a graphical representation of a layout of the functional circuit as well as a textual representation of the layout of the functional circuit. In some embodiments, the check includes analysis of one of the graphical representation or the textual representation. In some embodiments, the check includes analysis of both of the graphical representation and the textual representation. In some embodiments, the check includes a layout versus schematic (LVS) check of the GDS file. The LVS check compares the layout of the GDS file with a schematic diagram of the functional circuit to help ensure that the layout will have the functionality of the schematic diagram. In some embodiments, the check includes a design rules check (DRC) of the GDS file. The DRC check compares the layout of the GDS file with manufacturing capabilities of a process used to form the functional circuit. In some embodiments, the DRC check includes determining whether the elements of the GDS file have sufficient spacing to account for manufacturing error during formation of the functional circuit.

In operation 204, a dummy layer is added to a contact pad of the functional circuit. The dummy layer is used to position the contact pad at a location aligned with a corresponding contact pad of a connecting substrate, e.g., connecting substrate 110 (FIG. 1). The location of the dummy layer is determined based on a location of the contact pad of the connecting substrate. The dummy layer does not impact a size or shape of the contact pad of the functional circuit. In some embodiments, the dummy layer is added using a GDS file of the connecting substrate.

Figure 3:
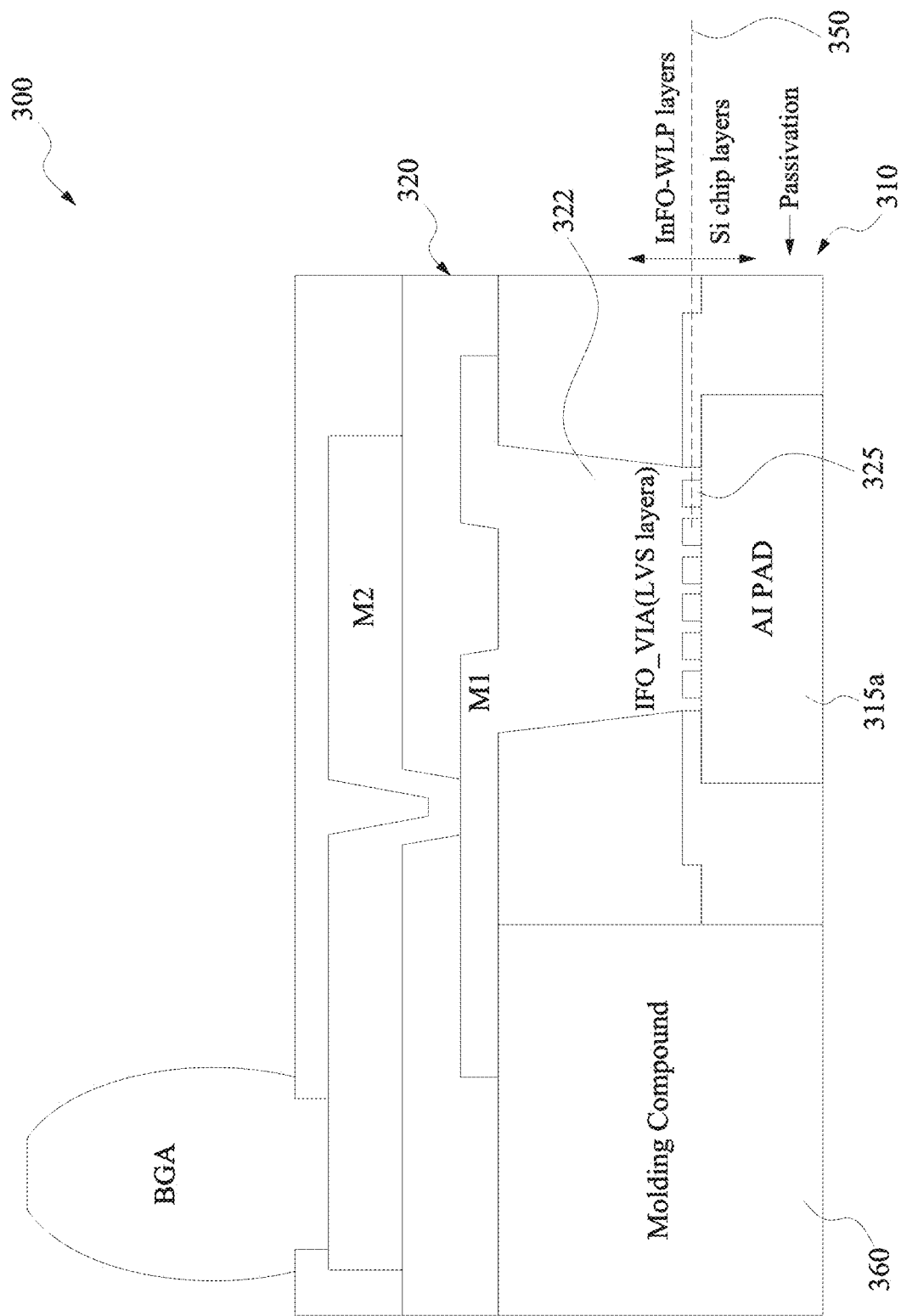
FIG. 3 is a cross sectional view of an integrated circuit stack in accordance with some embodiments.

FIG. 3 is a cross sectional view of an integrated circuit stack 300 in accordance with some embodiments. Integrated circuit stack 300 is similar to a connection between functional circuit 120 and connecting substrate 110 of FIG. 1. Same elements have a same reference number as integrated circuit stack 100 increased by 200. In comparison with integrated circuit stack 100, integrated circuit stack 300 includes a dummy layer 325 at an interface 350 between first functional circuit 320 and connecting substrate 310. Integrated circuit stack 300 also includes a molding compound 360 adjacent to interface 350. In some embodiments, an inductor is located within molding compound 360 to help with an LVS check of connecting substrate 310.

Including dummy layer 325 in integrated circuit stack 300 maintains dimensions of contact pad 322. In some embodiments, dummy layer 325 is a physical extension of contact pad 322. In some embodiments, dummy layer 325 is a representation of a contact pad 322 at interface 350. Adding dummy layer 325 helps to ensure proper alignment between contact pad 322 and contact pad 315a. Proper alignment helps to reduce the risk of an open circuit or a short circuit in integrated circuit stack 300 in comparison with approaches which do not use dummy layer 325.

Returning to FIG. 2, in some embodiments, an additional check of the functional circuitry is performed on the functional circuit in operation 204 in order to determine whether inclusion of the dummy layer impacts the layout of the functional circuit. In some embodiments, the additional check in operation 204 is a same check as that performed in operation 202. In some embodiments, the additional check in operation 204 is different from the check performed in operation 202.

In some embodiments, the dummy layer is added to a single contact pad of the functional circuit. In some embodiments, the dummy layer is added to multiple contact pads of the functional circuit. In some embodiments, the dummy layer is added to all contact pads of the functional circuit. In some embodiments, a number and location of contact pads to which the dummy layer is added is determined based on components within the connecting substrate.

In operation 206, the contact pad location of the functional circuit is converted to the connecting substrate. The contact pad location of the functional circuit is determined based on the location of the dummy layer. In some embodiments, the contact pad location of the functional circuit is added into a GDS file of the connecting substrate.

Figure 4B:
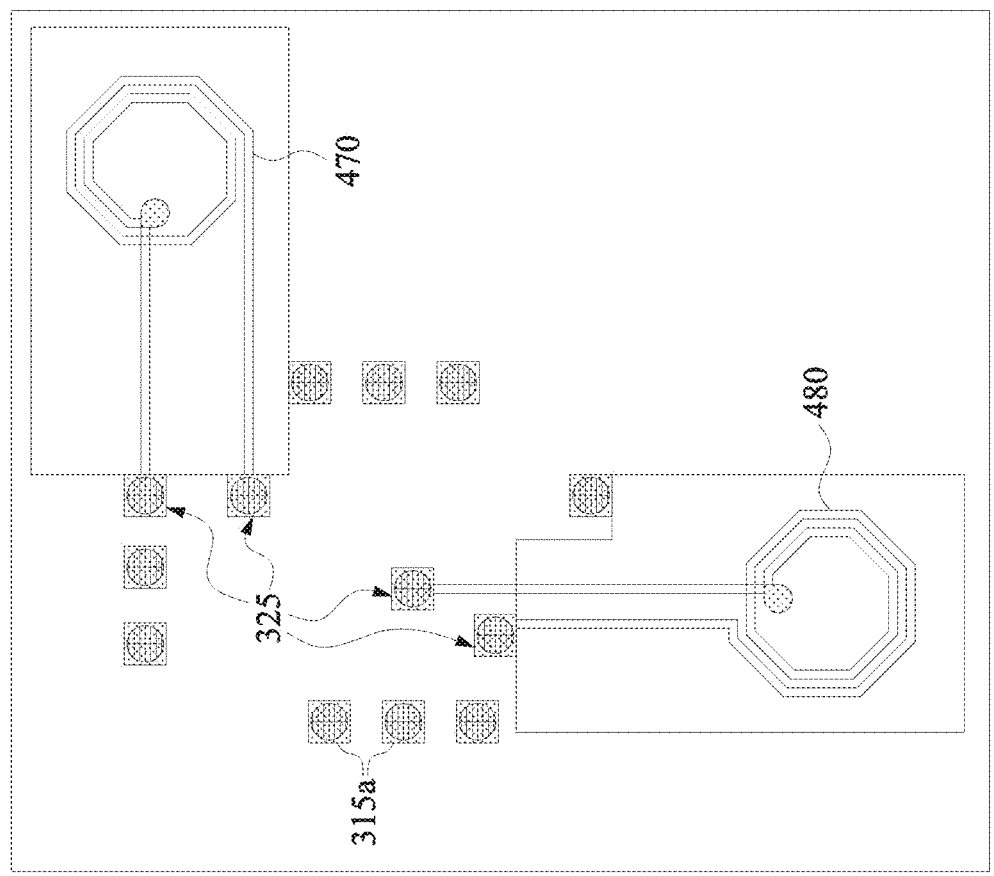
FIG. 4B is a view of a layout of a connecting substrate in accordance with some embodiments.
Figure 4A:
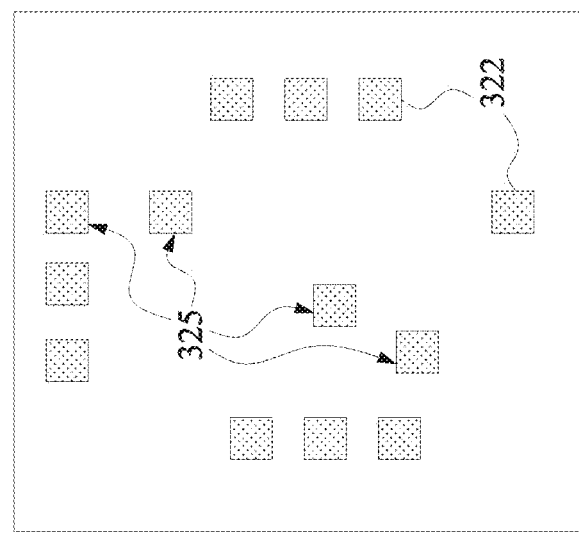
FIG. 4A is a view of a layout of a functional circuit in accordance with some embodiments.

FIG. 4A is a view of a layout of a functional circuit in accordance with some embodiments. The layout of FIG. 4A is an exemplary layout of functional circuit 320 (FIG. 3). Functional circuit 320 includes multiple contact pads 322 in FIG. 4A. All contact pads 322 include dummy layer 325. In some embodiments, less than all contact pads 322 include dummy layer 325. In some embodiments, functional circuit 320 also includes radio frequency (RF) pads.

FIG. 4B is a view of a layout of a connecting substrate in accordance with some embodiments. The layout of FIG. 4B is an exemplary layout of connecting substrate 310 (FIG. 3). Connecting substrate 310 includes multiple contact pads 315a in FIG. 4B. The layout of FIG. 4B includes the location of dummy layer 325 added to a contact pads 315a corresponding to contact pads 325 which include the dummy layer. Dummy layer 325 from functional circuit 320 is aligned with contact pads 315a of connecting substrate 310. In some embodiments, connecting substrate also includes RF pads.

Connecting substrate 310 also includes an inductor 470 and an inductor 480. Inductor 470 is connected to two contact pads 315a which include the added dummy layer 325. Inductor 480 is also connected to two contact pads 315a which include the added dummy layer 325. In some embodiments, at least one of inductor 470 or inductor 480 are located in molding compound 360 (FIG. 3). In some embodiments, one of inductor 470 or inductor 480 is located in molding compound 360 and the other of inductor 470 and inductor 480 is located at another location of connecting substrate 310.

In some embodiments, dummy layer 325 is added to select contact pads 322 in operation 204 based on a location of inductor 470 and inductor 480. In some embodiments, dummy layer 325 is added every connection point of an inductor in connecting substrate 310. In some embodiments, dummy layer 325 is added to less than all connection points of an inductor in connecting substrate 310. In some embodiments, dummy layer 325 is added to at least one contact pad 322 which is not a connecting point for an inductor in connecting substrate 310.

Returning to FIG. 2, if the dummy layer is aligned with the contact pads of the connecting substrate, as indicated by "yes" in FIG. 2, method 200 proceeds to operation 208. If the dummy layer converted to the connecting substrate is misaligned with respect to contact pads of the connecting substrate, as indicated by "no" in FIG. 2, method 200 returns to operation 204 and a location of the dummy layer in the functional circuit is corrected. In some embodiments, alignment is determined based on the GDS file of the connecting substrate. In some embodiments, misalignment is determined based on an error tolerance. The error tolerance permits a portion of the dummy layer to extend beyond the contact pad of the connecting substrate. If the portion of the dummy layer extending beyond the contact pad of the connecting substrate is above a threshold value, the dummy layer is considered misaligned and method 200 returns to operation 204. If the portion of the dummy layer extending beyond the contact pad of the connecting substrate is equal to or less than the threshold value, the dummy layer is considered aligned and method 200 proceeds to operation 208. The threshold value is determined based on a technology node of the integrated circuit stack, empirical evidence, simulation results, or another suitable manner of monitoring functionality of the integrated circuit stack.

In operation 208 an LVS check is performed on the connecting substrate. The LVS check compares the layout of the connecting substrate which includes the dummy layer with a schematic diagram of the connecting substrate. The LVS check helps to ensure that the layout of the connecting substrate is capable of performing the functionality of the schematic diagram of the connecting substrate. A tool used to perform the LVS check is not limited to a particular tool. In some embodiments, the LVS check is performed using Calibre by Mentor Graphics, Quartz LVS by Magma Design Automation, IC Validator by Synopsys or another suitable LVS tool.

In some embodiments, the LVS check also includes determining a distance between inductors in the connecting substrate. For example, a distance between inductor 470 and inductor 480 (FIG. 4B) is determined during the LVS check in operation 208, in some embodiments. The distance between inductors in the connecting substrate helps to determine whether an increased risk of a short circuit or an open circuit exists. If the distance between the inductors is above a first value, an increased the risk of an open circuit in the integrated circuit stack exists. If the distance between the inductors is below a second value, an increased risk of a short circuit in the integrated circuit stack exists. If the distance between the inductors ranges from the first value to the second value, a lower risk of an open circuit or a short circuit in the integrated circuit stack exists.

If the connecting substrate including the dummy layer passes the LVS check, as indicated by "yes" in FIG. 2, method 200 is completed at operation 210. If the connecting substrate including the dummy layer fails the LVS check, as indicated by "no" in FIG. 2, method 200 returns to operation 204 and a location of the dummy layer in the functional circuit is corrected. In some embodiments, the LVS check is failed if the distance between the inductors in the connecting substrate is outside an acceptable range. In some embodiments, the LVS check is failed if the layout of the connecting substrate does not match the functionality of the schematic diagram of the connecting substrate.

In operation 210, method 200 is completed. In some embodiments, completing method 200 includes generating at least one photomask based on results of method 200. In some embodiments, the at least one photomask is based on received information related to the connecting substrate or the functional circuit. In some embodiments, the received information includes the GDS file.

The photomask is formed by patterning a blank photomask. In some embodiments, the blank photomask includes a low thermal expansion material (LTEM), such as an LTEM glass, silicon, silicon carbide, silicon oxide, titanium oxide, Black Diamond® (a trademark of Applied Materials), or another suitable LTEM. In some embodiments, blank photomask is patterned with reflective material. The reflective material reflects radiation in a lithography waveband used to form the connecting substrate or the functional circuit. In some embodiments, the lithography waveband is an ultraviolet waveband, such as extreme ultraviolet (EUV) or vacuum ultraviolet (VUV), an electron beam (e-beam) or another suitable waveband. In some embodiments, the reflective material includes a multilayer structure. In some embodiments, the reflective material includes alternating layers of molybdenum (Mo) and silicon (Si). In some embodiments, the blank photomask is patterned with absorptive material. The absorptive material absorbs radiation in a lithography waveband used to form the connecting substrate or the functional circuit. The photomask is etched to transfer the pattern of reflective or absorptive material to the photomask.

In comparison with methods which do not include the dummy layer, method 200 reduces an amount of time for performing an LVS check on an integrated circuit stack. The amount of time for performing the LVS check is reduced because a size of the GDS file for each of the functional circuit and the connecting substrate is smaller than a size of the GDS file for an entire stack. The inclusion of the dummy layer facilitates analysis of the function circuit and the connecting substrate separately, instead of the entire stack. The iterative process of adjusting the layout of either the functional circuit or the connecting substrate includes analysis of the adjusted layout. Method 200 performs the analysis on the adjusted portion of the integrated circuit stack without performing the analysis on the entire integrated circuit stack. For example, performing the LVS check on the connecting substrate does not include performing the LVS check on the functional circuit during the same analysis. As a result an amount of time used to generate the layout is reduced in comparison to approaches which do not include the dummy layer.

Figure 5:
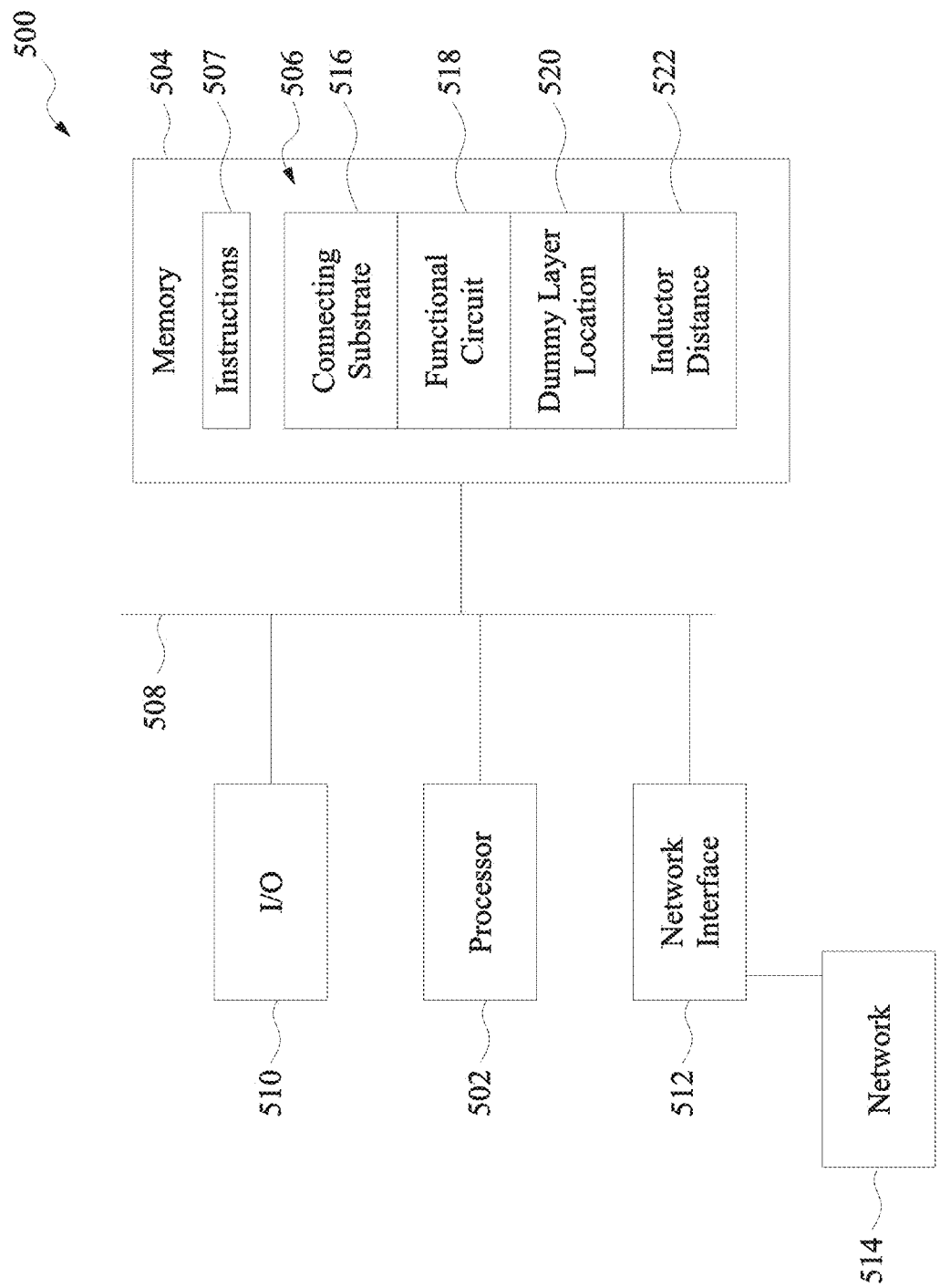
FIG. 5 is a block diagram of a specific purpose device for performing verification of an integrated circuit stack in accordance with some embodiments.

FIG. 5 is a block diagram of a specific purpose system 500 for performing verification of an integrated circuit stack in accordance with some embodiments. System 500 includes a hardware processor 502 and a non-transitory, computer readable storage medium 504 encoded with, i.e., storing, the computer program code 506, i.e., a set of executable instructions. Computer readable storage medium 504 is also encoded with instructions 507 for interfacing with manufacturing machines for producing the memory array. The processor 502 is electrically coupled to the computer readable storage medium 504 via a bus 508. The processor 502 is also electrically coupled to an I/O interface 510 by bus 508. A network interface 512 is also electrically connected to the processor 502 via bus 508. Network interface 512 is connected to a network 514, so that processor 502 and computer readable storage medium 504 are capable of connecting to external elements via network 514. The processor 502 is configured to execute the computer program code 506 encoded in the computer readable storage medium 504 in order to cause system 500 to be usable for performing a portion or all of the operations as described in method 200.

In some embodiments, the processor 502 is a central processing unit (CPU), a multi-processor, a distributed processing system, an application specific integrated circuit (ASIC), and/or a suitable processing unit.

In some embodiments, the computer readable storage medium 504 is an electronic, magnetic, optical, electromagnetic, infrared, and/or a semiconductor system (or apparatus or device). For example, the computer readable storage medium 504 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 504 includes a compact disk-read only memory (CD-ROM), a compact disk-read/write (CD-R/W), and/or a digital video disc (DVD).

In some embodiments, the storage medium 504 stores the computer program code 506 configured to cause system 500 to perform method 200. In some embodiments, the storage medium 504 also stores information needed for performing a method 200 as well as information generated during performing the method 200, such as a connecting substrate parameter 516, a functional circuit parameter 518, a dummy layer location parameter 520, an inductor distance parameter 522, and/or a set of executable instructions to perform the operation of method 200.

In some embodiments, the storage medium 504 stores instructions 507 for interfacing with manufacturing machines. The instructions 507 enable processor 502 to generate manufacturing instructions readable by the manufacturing machines to effectively implement method 400 during a manufacturing process.

System 500 includes I/O interface 510. I/O interface 510 is coupled to external circuitry. In some embodiments, I/O interface 510 includes a keyboard, keypad, mouse, trackball, trackpad, and/or cursor direction keys for communicating information and commands to processor 502.

System 500 also includes network interface 512 coupled to the processor 502. Network interface 512 allows system 500 to communicate with network 514, to which one or more other computer systems are connected. Network interface 512 includes wireless network interfaces such as BLUETOOTH, WIFI, WIMAX, GPRS, or WCDMA; or wired network interface such as ETHERNET, USB, or IEEE-1394. In some embodiments, method 200 is implemented in two or more systems 500, and information such as memory type, memory array layout, I/O voltage, I/O pin location and charge pump are exchanged between different systems 500 via network 514.

System 500 is configured to receive information related to a connecting substrate through I/O interface 510. The information is transferred to processor 502 via bus 508 and stored in computer readable medium 504 as connecting substrate parameter 516. In some embodiments, connecting substrate parameter 516 is a GDS file or another suitable representation of the connecting substrate. System 500 is configured to receive information related to a functional circuit through I/O interface 510. The information is stored in computer readable medium 504 as functional circuit parameter 518. In some embodiments, functional circuit parameter 518 is a GDS file or another suitable representation of the functional circuit. In some embodiments, system 500 is configured to receive information related to dummy layer location through I/O interface 510. In some embodiments, system 500 is configured to generate information related to the dummy layer location. The information is stored in computer readable medium 504 as dummy layer location parameter 520. System 500 is configured to receive information related to an inductor distance through I/O interface 510. The information is stored in computer readable medium 504 as inductor distance parameter 522.

During operation, processor 502 executes instructions 507 to perform a check on the functional circuit using information stored in functional circuit parameter 518. In some embodiments, processor 502 executes instructions 507 to determine a location of a dummy layer based on connecting substrate parameter 516 and store that information in dummy layer location parameter 520. Processor 502 executes instructions 507 to add a dummy layer at a dummy layer location to the functional circuit based on dummy layer location parameter 520. Processor 502 executes instructions to adjust a location of the dummy layer in the functional circuitry based on feedback from analyzing connecting substrate parameter 516. Processor 502 executes instructions 507 to transfer the dummy layer into the connecting substrate based on dummy layer location parameter 520. Processor 502 executes instructions 507 to perform an LVS check on the connecting substrate. In some embodiments, performing the LVS check on the connecting substrate includes determining whether a separation distance between inductors in the connecting substrate is within a tolerance based on inductor distance parameter 522. In some embodiments, processor 502 executes instructions 507 to generate signals for ordering formation of a photomask based on connecting substrate parameter 516 or functional circuit parameter 518.

An aspect of this description relates to a method of verifying an integrated circuit stack. The method includes adding a dummy layer to a contact pad of a functional circuit, wherein a location of the dummy layer is determined based on a location of a contact pad of a connecting substrate. The method further includes converting the dummy layer location to the connecting substrate. The method further includes performing a layout versus schematic (LVS) check of the connecting substrate including the dummy layer in response to a determination that the dummy layer is aligned with the contact pad of the connecting substrate. In some embodiments, converting the dummy layer location to the connecting substrate includes adding the dummy layer location to a graphic database system (GDS) file of the connecting substrate. In some embodiments, the method further includes analyzing the functional circuit to determine proper functionality prior to adding the dummy layer. In some embodiments, adding the dummy layer to the functional circuit includes adding the dummy layer to a GDS file of the functional circuit. In some embodiments, adding the dummy layer to the functional circuit includes physically extending the contact pad of the functional circuit. In some embodiments, the method further includes analyzing the functional circuit to determine proper functionality after adding the dummy layer. In some embodiments, the method further includes forming at least one photomask in response to the connecting substrate satisfying the LVS check. In some embodiments, the method further includes performing an LVS check on the functional circuit prior to or after performing the LVS check on the connecting substrate. In some embodiments, forming the LVS check on the connecting substrate includes determining a distance between inductors in the connecting substrate.

An aspect of this description relates to a method of verifying an integrated circuit stack. The method includes adding a first dummy layer to a first contact pad of a first functional circuit, wherein a location of the first dummy layer is determined based on a location of a first contact pad of a connecting substrate. The method further includes adding a second dummy layer to a second contact pad of a second functional circuit, wherein a location of the second dummy layer is determined based on a location of a second contact pad of the connecting substrate, wherein the first functional circuit is different from the second functional circuit. The method further includes converting the first dummy layer location to the connecting substrate. The method further includes converting the second dummy layer location to the connecting substrate. The method further includes adjusting the first dummy layer location in the first functional circuit in response to a determination that the first dummy layer location is misaligned with the first contact pad of the connecting substrate. In some embodiments, adding the first dummy layer to the first functional circuit includes adding the first dummy layer to the first functional circuit prior to adding the second dummy layer to the second functional circuit. In some embodiments, the method further includes adding a third dummy layer to a third contact pad of the first functional circuit, wherein a location of the third dummy layer is determined based on a location of a third contact pad of the connecting substrate. In some embodiments, the method further includes performing a layout versus schematic (LVS) check of the connecting substrate including the first dummy layer in response to a determination that the first dummy layer is aligned with the first contact pad of the connecting substrate. In some embodiments, the method further includes performing an LVS check of the connecting substrate including the second dummy layer in response to a determination that the second dummy layer is aligned with the second contact pad of the connecting substrate. In some embodiments, the method further includes adjusting the second dummy layer location in the second functional circuit in response to a determination that the second dummy layer location is misaligned with the second contact pad of the connecting substrate. In some embodiments, the method further includes manufacturing at least one photomask for the connecting substrate following converting the second dummy layer location to the connecting substrate.

An aspect of this description relates to a system. The system includes a non-transitory computer readable medium configured to store instructions thereon. The system further includes a processor connected to the non-transitory computer readable medium. The processor is configured to execute the instructions for adding a dummy layer to a contact pad of a functional circuit, wherein a location of the dummy layer is determined based on a location of a contact pad of a connecting substrate. The processor is configured to execute the instructions for converting the dummy layer location to the connecting substrate. The processor is configured to execute the instructions for performing a layout versus schematic (LVS) check of the connecting substrate including the dummy layer in response to a determination that the dummy layer is aligned with the contact pad of the connecting substrate. The processor is configured to execute the instructions for adjusting the dummy layer location in the functional circuit in response to a determination that the dummy layer location is misaligned with the contact pad of the connecting substrate. In some embodiments, the processor is configured to execute the instructions for adding a second dummy layer to a second contact pad of a second functional circuit, wherein a location of the second dummy layer is determined based on a location of a second contact pad of the connecting substrate. In some embodiments, the processor is configured to execute the instructions for converting the dummy layer location to the connecting substrate by adding the dummy layer location to a graphic database system (GDS) file of the connecting substrate. In some embodiments, the processor is configured to execute the instructions for instructing a manufacturing machine for manufacturing at least one photomask for the connecting substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of verifying an integrated circuit stack, the method comprising:

adding a dummy layer to a contact pad of a functional circuit, wherein a location of the dummy layer is determined based on a location of a contact pad of a connecting substrate;

converting the dummy layer location to the connecting substrate; and performing a layout versus schematic (LVS) check of the connecting substrate including the dummy layer in response to a determination that the dummy layer is aligned with the contact pad of the connecting substrate.

2. The method of claim 1, wherein converting the dummy layer location to the connecting substrate comprises adding the dummy layer location to a graphic database system (GDS) file of the connecting substrate.

3. The method of claim 1, further comprising analyzing the functional circuit to determine proper functionality prior to adding the dummy layer.

4. The method of claim 1, wherein adding the dummy layer to the functional circuit comprises adding the dummy layer to a GDS file of the functional circuit.

5. The method of claim 1, wherein adding the dummy layer to the functional circuit comprises physically extending the contact pad of the functional circuit.

6. The method of claim 1, further comprising analyzing the functional circuit to determine proper functionality after adding the dummy layer.

7. The method of claim 1, further comprising forming at least one photomask in response to the connecting substrate satisfying the LVS check.

8. The method of claim 1, further comprising performing an LVS check on the functional circuit prior to or after performing the LVS check on the connecting substrate.

9. The method of claim 1, wherein forming the LVS check on the connecting substrate comprises determining a distance between inductors in the connecting substrate.

10. A method of verifying an integrated circuit stack, the method comprising:

adding a first dummy layer to a first contact pad of a first functional circuit, wherein a location of the first dummy layer is determined based on a location of a first contact pad of a connecting substrate;

adding a second dummy layer to a second contact pad of a second functional circuit, wherein a location of the second dummy layer is determined based on a location of a second contact pad of the connecting substrate, wherein the first functional circuit is different from the second functional circuit;

converting the first dummy layer location to the connecting substrate;

converting the second dummy layer location to the connecting substrate;

adjusting the first dummy layer location in the first functional circuit in response to a determination that the first dummy layer location is misaligned with the first contact pad of the connecting substrate; and performing a first layout versus schematic (LVS) check of the connecting substrate including the first dummy layer in response to a determination that the first dummy layer is aligned with the first contact pad of the connecting substrate.

11. The method of claim 10, wherein adding the first dummy layer to the first functional circuit comprises adding the first dummy layer to the first functional circuit prior to adding the second dummy layer to the second functional circuit.

12. The method of claim 10, further comprising adding a third dummy layer to a third contact pad of the first functional circuit, wherein a location of the third dummy layer is determined based on a location of a third contact pad of the connecting substrate.

13. The method of claim 10, further comprising performing an LVS check on the functional circuit prior to or after performing the first LVS check on the connecting substrate.

14. The method of claim 10, further comprising performing a second LVS check of the connecting substrate including the second dummy layer in response to a determination that the second dummy layer is aligned with the second contact pad of the connecting substrate.

15. The method of claim 10, further comprising adjusting the second dummy layer location in the second functional circuit in response to a determination that the second dummy layer location is misaligned with the second contact pad of the connecting substrate.

16. The method of claim 10, further comprising manufacturing at least one photomask for the connecting substrate following converting the second dummy layer location to the connecting substrate.

17. A system comprising:

a non-transitory computer readable medium configured to store instructions thereon; and a processor connected to the non-transitory computer readable medium, wherein the processor is configured to execute the instructions for:

adding a dummy layer to a contact pad of a functional circuit, wherein a location of the dummy layer is determined based on a location of a contact pad of a connecting substrate;

converting the dummy layer location to the connecting substrate;

performing a layout versus schematic (LVS) check of the connecting substrate including the dummy layer in response to a determination that the dummy layer is aligned with the contact pad of the connecting substrate; and adjusting the dummy layer location in the functional circuit in response to a determination that the dummy layer location is misaligned with the contact pad of the connecting substrate.

18. The system of claim 17, wherein the processor is configured to execute the instructions for adding a second dummy layer to a second contact pad of a second functional circuit, wherein a location of the second dummy layer is determined based on a location of a second contact pad of the connecting substrate.

19. The system of claim 17, wherein the processor is configured to execute the instructions for converting the dummy layer location to the connecting substrate by adding the dummy layer location to a graphic database system (GDS) file of the connecting substrate.

20. The system of claim 17, wherein the processor is configured to execute the instructions for instructing a manufacturing machine for manufacturing at least one photomask for the connecting substrate.

* * * * *